United States Patent [19]
Hsu

[11] Patent Number: 5,728,972
[45] Date of Patent: Mar. 17, 1998

[54] MULTIPLE CHIP MODULE FOR PACKAGING INTEGRATED CIRCUITS

[75] Inventor: Chen-Chung Hsu, Taichung, Taiwan

[73] Assignee: United Microelectronics Corporation, Taiwan

[21] Appl. No.: 635,592

[22] Filed: Apr. 22, 1996

[51] Int. Cl.$^6$ .................................................. H01L 23/04
[52] U.S. Cl. ........................ 174/52.1; 361/808; 174/52.4
[58] Field of Search ...................... 174/52.4, 52.1; 257/685, 686, 678, 680, 723; 361/728, 729, 730, 744, 735, 808, 810; 437/208, 915; 438/109, 110, 125

[56] References Cited

U.S. PATENT DOCUMENTS 5,327,325   7/1994   Nicewarner, Jr. ..................... 361/760

FOREIGN PATENT DOCUMENTS 362122161A   6/1987   Japan ..................... 257/685
405129516A   5/1993   Japan ..................... 257/723
405275611A   10/1993  Japan ..................... 257/723

*Primary Examiner*—Kristine L. Kincaid
*Assistant Examiner*—Kristina Soderquist
*Attorney, Agent, or Firm*—Rabin, Champagne & Lynt, P.C.

[57] ABSTRACT

A multiple chip module for packaging integrated circuit chips. It has a module body with multiple faces and covers. One of the faces has conduction pads. Each of the other faces has a chip receiving compartment. Each compartment includes at least one chip receiving section. The bottom boundary of the chip receiving section faces the center of the module body and each chip receiving section includes a base surrounding its bottom boundary for locating and bonding one of the chips. Conduction areas are provided on the base of each of the chip receiving sections for connecting with the pad windows of one of the chips and are connected with corresponding conduction pads through a layout in the module body. The covers cover the chip receiving compartments for sealing the chips therein.

16 Claims, 5 Drawing Sheets

MULTIPLE CHIP MODULE FOR PACKAGING INTEGRATED CIRCUITS

BACKGROUND OF THE INVENTION

1. Field of the Invention

This invention relates in general to a multiple chip module for packaging integrated circuits, especially to a multiple chip module with a plurality of faces, for packaging integrated circuits, that uses flip-chip technology.

2. Description of the Related Art

Nowadays, due to the increased complexity of computer systems, there is a need to fabricate integrated circuits with more semiconductor devices. For increasing the device density, it becomes necessary to reduce the dimensions of the devices. Therefore, submicron related processes are now being studied and developed. However, there is a limitation to the degree to which the dimensions of the devices can be scaled down. For instance, in the development of photolithographic techniques, resolution is limited by the wavelength of the light source. Using a larger chip can, of course, also provide more devices. However, increasing the chip size causes obvious space problems and also reduces the yield rate and raises the cost of production.

Therefore, much research has been carried out to increase the device density of multi-chip modules. Most of the research concerns the use of planar techniques or planar stacking techniques. Only a few of the studied techniques are three-dimensional. However, three-dimensional structures usually require a complex packing process, or experience difficulty in mass production or insufficient heat dissipation of the chip, so that they still are not being used in industry.

SUMMARY OF THE INVENTION

It is therefore an object of the invention to provide a multiple chip module for packaging integrated circuits having an increased packing density.

Another object of the invention is to provide a multiple chip module for packaging integrated circuits, wherein the chips are not tightly packed, in order to enhance heat dissipation.

Another object of the invention is to provide a multiple chip module for packaging integrated circuits, having a simple packing layout that is suitable for mass production.

The invention achieves the above-identified objects by providing a multiple chip module for packaging integrated circuit chips. It includes a module body with multiple faces, and a plurality of chips and covers. One of the faces of the module body has a plurality of conduction pads. Each face has a chip receiving compartment, and each chip receiving compartment includes at least one chip receiving section. A bottom boundary of each chip receiving section faces the center of the module body and each chip receiving section includes a base surrounding the bottom boundary, for locating and bonding one of the chips. Conduction areas are provided on the base of each chip receiving section for electrical connection with pad windows of the chip. Within the module body, a layout is provided that connects the conduction areas with corresponding ones of the conduction pads. Cover members cover the faces for sealing the chips.

BRIEF DESCRIPTION OF THE DRAWINGS

Other objects, features, and advantages of the invention will become apparent by way of the following detailed description of the preferred but non-limiting embodiments. The description is trade with reference to the accompanying drawings in which.

DESCRIPTION OF THE PREFERRED EMBODIMENT

Figure 1:
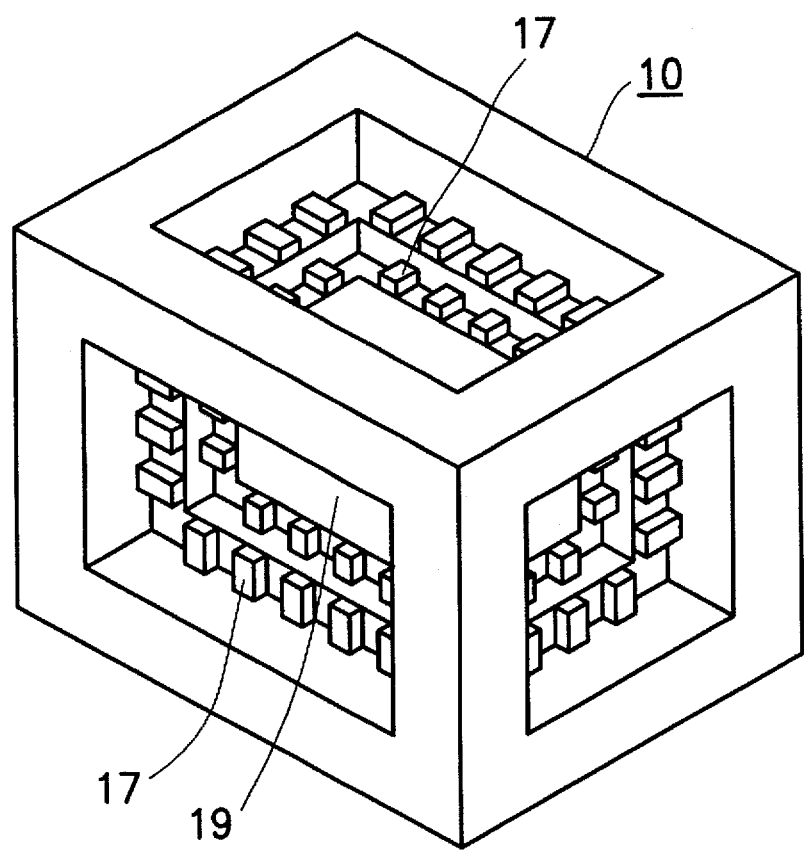
FIG. 1 is a perspective view of a multiple chip module according to a first or second embodiment of the invention.

A first embodiment of the invention, which includes a multiple chip module body 10, is shown in FIGS. 1, 2A, 2B, and 3. The module body is in the shape of a right quadrahedron with each face in the shape of a rectangle. Each face of the module body 10 includes a chip receiving compartment 12. The bottom face 10A of the module body 10 has a plurality of conduction pads 11 (the areas cross-hatched with double lines in FIG. 2A) for connection with metal contacts in a pin grid array socket which then can be mounted on a circuit board to mount the module thereto. Each chip receiving compartment 12 includes at least one chip receiving section. In the present embodiment of the invention, each chip receiving compartment 12 includes two chip receiving sections, including inner section 13 and outer section 14. The bottom boundaries 18 and 19 of the chip receiving sections 13 and 14 are planes that face the center of the module body 10. Each chip receiving section has a base surrounding its bottom boundary, for locating a chip. Thus, the chip receiving sections 13 and 14 have respective bases 15 and 16. Each base has a plurality of conduction areas 17 (the areas cross-hatched with single lines in FIGS. 2A and 2B) which are connected with the pad windows of the chip (not shown in FIGS. 2A and 2B) in the corresponding chip receiving section. The module body 10 can be made of materials such as ceramic or plastic and its layout circuits 20 are built in to connect each conduction area 17 to a corresponding conduction pad 11. That is, the exact electrical connections made between the conduction areas 17 and the conduction pads 11 are determined by layout circuits formed within the module body 10, which make the actual connections.

The number of the conduction areas 17 and the conduction pads 11, the layout circuits of the conduction areas 17 and the conduction pads 11, and the dimensions of the chip receiving sections are determined according to actual requirements. Therefore, the dimensions of the bottom boundaries 18 and 19 of the chip receiving sections 13 and 14 in different chip receiving compartments 12 may be different. However, the inner chip receiving section 13 in any one chip receiving compartment has smaller dimensions than the outer chip receiving section 14 in that one chip receiving compartment.

In the first embodiment, only the outer periphery of the bottom face 10A of the module body has conduction pads, which limits the number of permissible conduction pads. This is suitable for integrated circuit packaging with fewer I/O pins, and has the advantage of providing more room for chips.

Figure 2A:
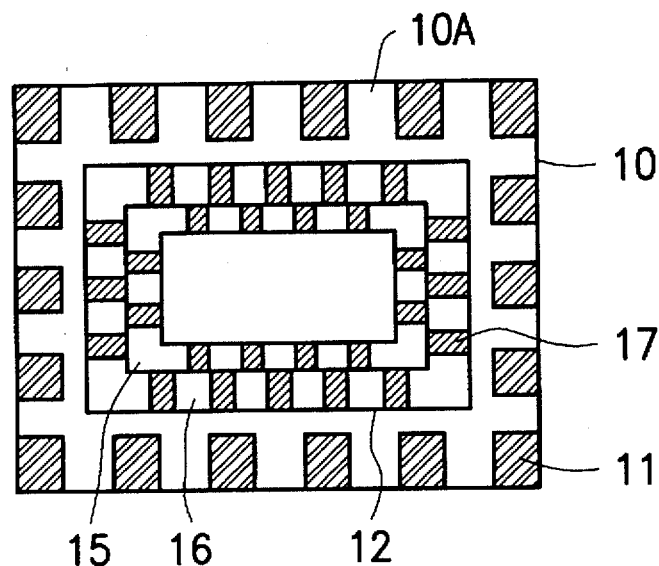
FIG. 2A is a bottom view of the first embodiment of the invention.
Figure 2B:
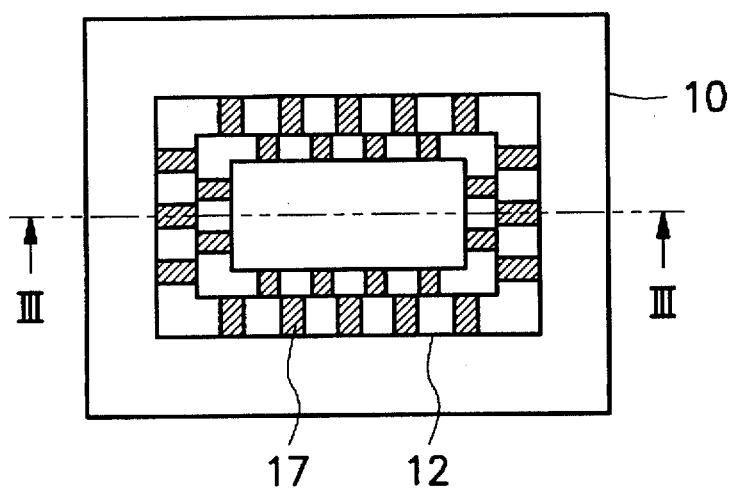
FIG. 2B is a top or side view of the first or second embodiment of the invention.
Figure 3:
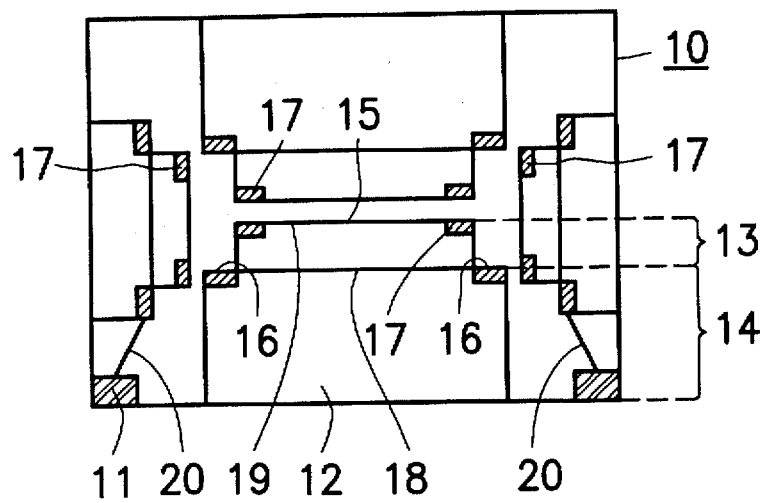
FIG. 3 is a cross-sectional view of the first embodiment of the invention along line III—III taken in FIG. 2B.
Figure 4:
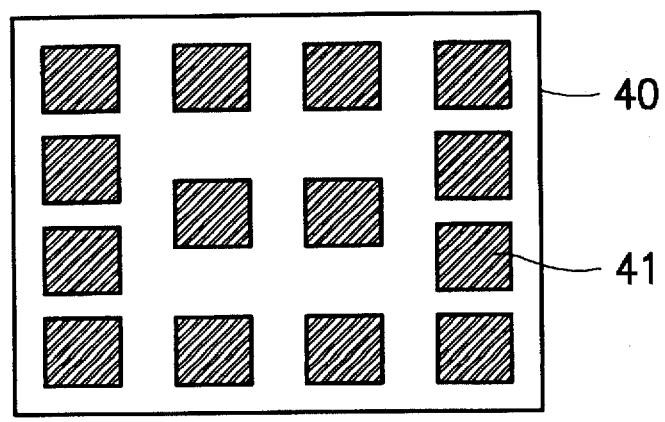
FIG. 4 is a bottom view of the second embodiment of the invention.

When more I/O pins are required, a second embodiment with another structure for the module can be used. The second embodiment is shown in FIGS. 1, 2B, and 4 where FIG. 4 is its bottom view and FIG. 1 is its perspective view. The second embodiment is similar to the first embodiment except that the entire bottom face of the module body is provided with conduction pads 41 for connection with metal contacts in a pin grid array socket, so that the connection pads are connected to the pins of the grid, and the socket can then be mounted on a circuit board such as a printed circuit board, so that the module is mounted thereto. The other faces, the structure, the function, and the material of the second embodiment of the module are the same as those of the first embodiment, and therefore will not be described.

The second embodiment is suitable for integrated circuit packaging with more I/O pins. However, it has less room for chips. In the second embodiment, the entire bottom face is used to connect with metal contacts. Therefore, the bottom face has no chip receiving sections.

Figure 5A:
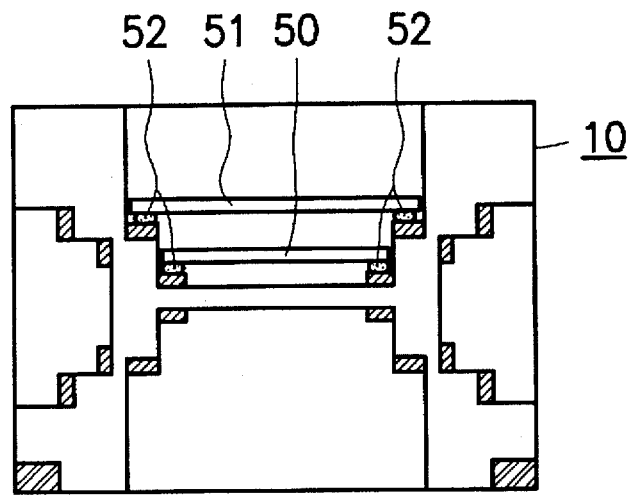
FIGS. 5A to 5D show part of the process of packing the modules of the first and second embodiments of the invention with chips.

FIGS. 5A to 5D illustrate the process of packaging chips using the multiple chip module according to the invention. Since the processes for packaging chips in the first and second embodiments are similar, only the packaging process for the first embodiment is discussed. First, as shown in FIG. 5A, the module body 10 shown in FIGS. 1, 2A, 2B and 3 is heated to a temperature between about 200° and about 300° C. Integrated circuit chips 50 and 51 are pressed inward of chip receiving sections with solder balls 52 on the pad windows of the integrated circuit chips, until the pad windows and corresponding conduction areas on the bases are bonded together, to complete the packaging of the first face of the module body.

Figure 5B:
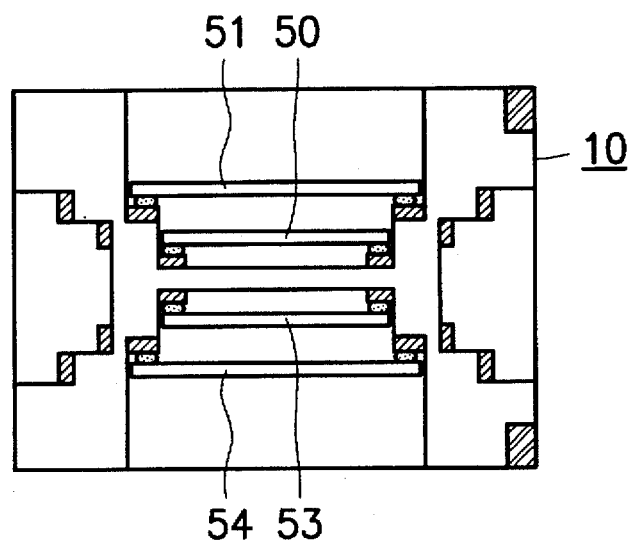

After that, as shown in FIG. 5B, the module body is inverted and, while the module body 10 is heated, chips 53 and 54 are pressed so that the pad windows and corresponding conduction areas on the bases are bonded by solder balls, to complete the packaging of the second face of the module body.

Figure 5C:
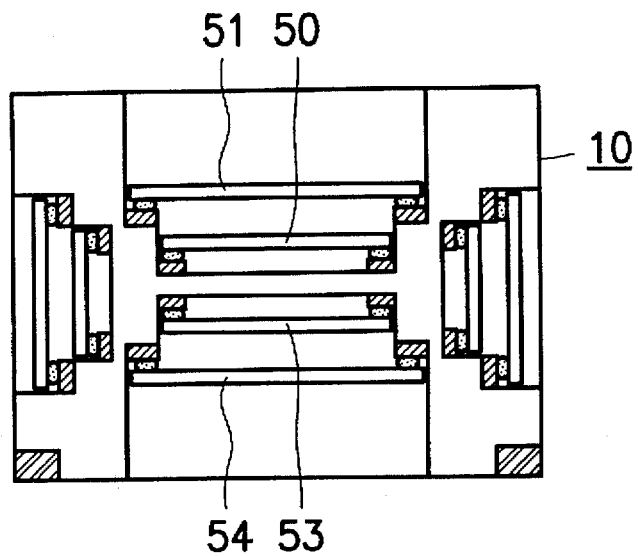

Then, as shown in FIG. 5C, the packaging of other faces of the module body is completed by repeating the process as shown in FIG. 5B.

Figure 5D:
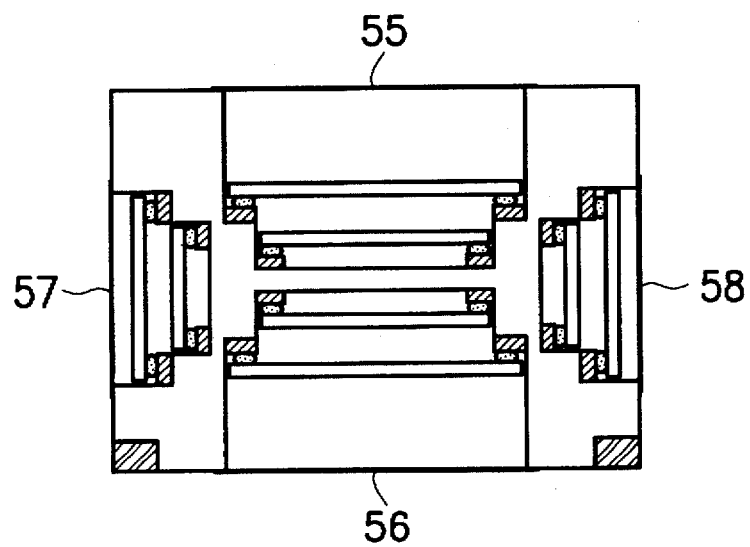

Finally, as shown in FIG. 5D, the outer chip receiving sections of the module body 10 are closed by covers 55, 56, 57 and 58 and sealed using solder to complete the packaging of the module. The covers can be made of metal to keep the chips sealed well.

Then the integrated circuit chip structure (module) can be packaged in a pin grid array structure by bonding the conduction pads of the module bottom face on an adapter with an appropriate layout itself having a pin structure to be mounted to female lead ends in the pin grid array socket, so that the conduction pads on the module bottom face are connected to the metal pins of the pin grid array socket. Other kinds of packaging with more faces or more layers of chips could also be assembled by repeating the above stated steps of turning the module body and bonding chips in the chip receiving sections, in a manner which would be apparent to those skilled in the art. The process of packaging of the second embodiment is almost the same as that of the first embodiment and will not be discussed.

As stated above, the multiple chip module according to the invention has the following advantages:

1. Efficient usage of space.
2. Very high packing density per unit volume.
3. Higher heat dissipation because chips are not tightly packed.
4. Modules can be designed to pack an unlimited number of chips.
5. The simplicity of the process of packaging the chips makes it suitable for mass production.

While the invention has been described by way of example and in terms of preferred embodiments, it is to be understood that the invention is not to be limited to the disclosed embodiments. To the contrary, the invention is intended to cover various modifications and similar arrangements included within the spirit and scope of the appended claims, the scope of which should be accorded the broadest interpretation so as to encompass all such modifications and similar structures.

What is claimed is:

1. A multiple chip module for packaging integrated circuit chips having pad windows, the module comprising:

a module body having at least three faces and a center, one of said faces having a plurality of conduction pads, each of said faces having a chip receiving compartment, each chip receiving compartment including at least one chip receiving section having a bottom boundary facing the center of said module body and a base surrounding said bottom boundary for locating a respective chip, and a plurality of conduction areas provided on said base of said chip receiving section and being connectable with pad windows of the respective chip, and a layout connecting said conduction areas with corresponding ones of said conduction pads.

2. A multiple chip module according to claim 1, wherein said module body is made of ceramic.

3. A multiple chip module according to claim 1, wherein said module body is made of plastic.

4. A multiple chip module according to claim 1, wherein at least one of said chip receiving compartments includes an outer chip receiving section and an inner chip receiving section having smaller dimensions than said outer chip receiving section, and disposed between the center of the module body and said outer chip receiving section.

5. A multiple chip module according to claim 1, further comprising a plurality of covers for sealing said chip receiving compartments.

6. A multiple chip module according to claim 5, wherein said covers are made of metal.

7. A multiple chip module according to claim 1, wherein said at least three faces comprises six faces.

8. A multiple chip module according to claim 7, wherein said module body has a shape of a right quadrahedron, and each face has a shape of a rectangle.

9. A multiple chip module for packaging integrated circuit chips having pad windows, the module comprising:

a module body having at least four faces and a center, one of said faces having a plurality of conduction pads, each of said faces, except said one face having a plurality of conduction pads, having a chip receiving compartment including at least one chip receiving section having a bottom boundary facing the center of said module body and a base surrounding said bottom boundary for locating a respective chip, and a plurality of conduction areas provided on said base of said chip receiving section and being connectable with pad windows of the respective chip, and a layout connecting said conduction areas with corresponding ones of said conduction pads.

10. A multiple chip module according to claim 9, wherein said module body is made of ceramic.

11. A multiple chip module according to claim 9, wherein said module body is made of plastic.

12. A multiple chip module according to claim 9, wherein at least one of said chip receiving compartments includes an outer chip receiving section, and an inner chip receiving section having smaller dimensions than said outer chip receiving section and disposed between the center of said module body and said outer chip receiving section.

13. A multiple chip module according to claim 9, further comprising a plurality of covers for sealing said chip receiving compartments.

14. A multiple chip module according to claim 13, wherein said covers are made of metal.

15. A multiple chip module according to claim 9, wherein said at least four faces comprises six faces.

16. A multiple chip module according to claim 15, wherein said module body has a shape of a right quadrahedron, and each face has a shape of a rectangle.

* * * * *